(12) United States Patent
Wu et al.

(10) Patent No.: US 9,875,862 B2
(45) Date of Patent: Jan. 23, 2018

(54) WATERPROOF SEALING ARRANGEMENT FOR A SIDE KEY ON A TERMINAL

(71) Applicant: ZTE CORPORATION, Shenzhen, Guangdong Province (CN)

(72) Inventors: Ling Wu, Shenzhen (CN); Bin Gao, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 15/318,675

(22) PCT Filed: Aug. 27, 2014

(86) PCT No.: PCT/CN2014/085293
§ 371 (c)(1),
(2) Date: Dec. 14, 2016

(87) PCT Pub. No.: WO2015/192473
PCT Pub. Date: Dec. 23, 2015

(65) Prior Publication Data
US 2017/0133173 A1 May 11, 2017

(30) Foreign Application Priority Data

Jun. 17, 2014 (CN) ..................... 2014 2 0324262 U

(51) Int. Cl.
*H01H 13/06* (2006.01)
*H05K 5/00* (2006.01)
(Continued)

(52) U.S. Cl.
CPC ........... *H01H 13/06* (2013.01); *G06F 1/1656* (2013.01); *H01H 13/48* (2013.01); *H04B 1/3888* (2013.01); *H04M 1/18* (2013.01); *H05K 5/0086* (2013.01); *H01H 2009/048* (2013.01); *H01H 2223/002* (2013.01); *H01H 2231/022* (2013.01); *H04M 1/236* (2013.01)

(58) Field of Classification Search
CPC .. H01H 13/06; H01H 2009/048; H01H 9/041; G06F 1/1656; H05K 5/0095
USPC ................................ 200/302.1, 302.2, 302.3
See application file for complete search history.

(56) References Cited

U.S. PATENT DOCUMENTS 4,352,968 A * 10/1982 Pounds .............. H01H 13/7006
200/302.2
7,705,255 B2 * 4/2010 Yokote ................... H01H 13/06
200/302.2

(Continued)

FOREIGN PATENT DOCUMENTS

CN 201243426 Y 5/2009
CN 103841774 A 6/2014
(Continued)

*Primary Examiner* — Vanessa Girardi
(74) *Attorney, Agent, or Firm* — Ling Wu; Stephen Yang; Ling and Yang Intellectual Property

(57) ABSTRACT

A waterproof apparatus for a terminal side key and a terminal are disclosed. The apparatus includes: a terminal shell (1) with a sidewall hole that is filled with a terminal side key (3), and a terminal side-key circuit board component (2) connected to a terminal mainboard (4), herein, the terminal side-key circuit board component (2) includes: a side-key circuit board (23), an arched metal film (22) fixedly connected to the side-key circuit board, and a circuit board waterproof ring (21) used for wrapping the side-key circuit board (23) and the arched metal film (22) as a whole, herein, the circuit board waterproof ring (21) wrapping the side-key circuit board (23) and the arched metal film (22) as a whole is combined with a sidewall of the terminal shell (1) in an interference-fitted manner.

11 Claims, 7 Drawing Sheets

(51) Int. Cl.
*G06F 1/16* (2006.01)
*H01H 13/48* (2006.01)
*H04B 1/3888* (2015.01)
*H04M 1/18* (2006.01)
*H04M 1/23* (2006.01)
*H01H 9/04* (2006.01)

(56) References Cited

U.S. PATENT DOCUMENTS

| | | | | |
|---|---|---|---|---|
| 8,008,591 | B2* | 8/2011 | Shi | H01H 13/06 |
| | | | | 200/302.2 |
| 8,089,017 | B2* | 1/2012 | Chen | G06F 3/0488 |
| | | | | 200/302.2 |
| 2009/0291709 | A1* | 11/2009 | Lee | G06F 1/1626 |
| | | | | 455/556.2 |
| 2013/0105288 | A1* | 5/2013 | Derengowski | H01H 13/063 |
| | | | | 200/302.2 |
| 2013/0313087 | A1* | 11/2013 | Le | H01H 13/06 |
| | | | | 200/302.2 |
| 2013/0319836 | A1* | 12/2013 | Chen | H01H 13/063 |
| | | | | 200/302.2 |

FOREIGN PATENT DOCUMENTS

| | | | |
|---|---|---|---|
| EP | 2738783 | A1 | 6/2014 |
| JP | 2004273208 | A | 9/2004 |
| JP | 2006033203 | A | 2/2006 |
| JP | 2013041740 | A | 2/2013 |

* cited by examiner

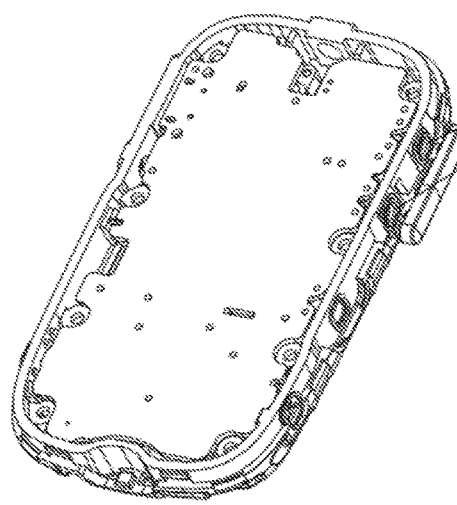
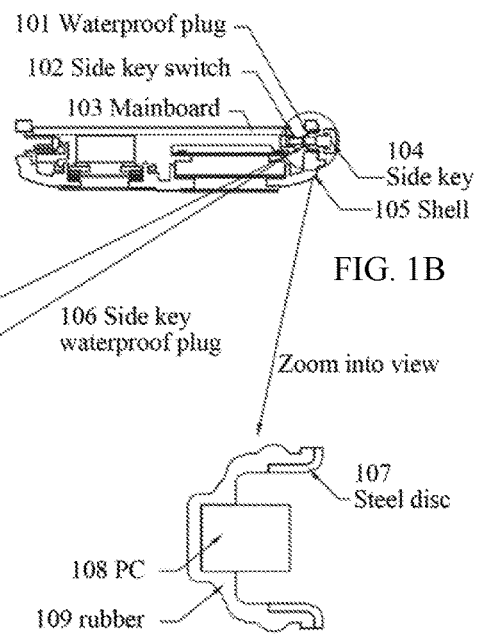
FIG. 1A
FIG. 1B
FIG. 1C
Prior Art

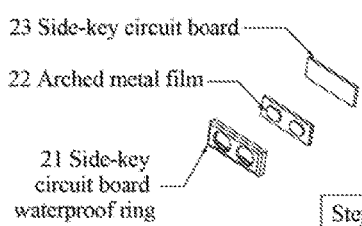
FIG. 6A
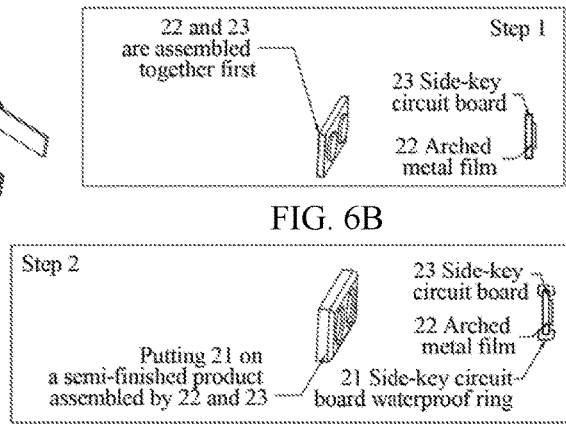
FIG. 6B
FIG. 6C
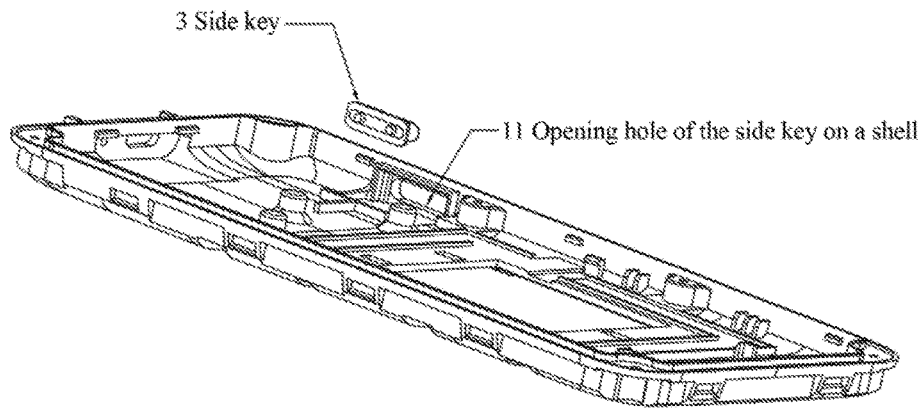
FIG. 7

WATERPROOF SEALING ARRANGEMENT FOR A SIDE KEY ON A TERMINAL

TECHNICAL FIELD

The present document relates to the field of communications, and specifically, to a waterproof apparatus for a terminal side key and a terminal.

BACKGROUND

With the increasing mobile phone products with a waterproof function in the sales market, the competitiveness requirement for waterproof reliability and waterproof level is also increased continuously, and the volume of this kind of products will be made smaller and smaller in order to possess better selling points, meanwhile a functional chip gradually occupies more space within the mobile phone body due to performance promotion, and for each key moving part such as a side key, the waterproof design thereof is required to be improved continuously so as to meet the gradually increased requirement for miniaturization.

The side key scheme of the waterproof mobile phones currently sold in the market may be roughly divided into the following forms: 1) FIGS. 1A-1C are schematic diagrams of a structure of a waterproof apparatus for a side key in the related art, as shown in FIGS. 1A-1C, a waterproof plug (101) is made by molding rubber (109), a steel disc (107) and polycarbonate (PC) (108) into one body and it is assembled on a shell (105) to play a waterproof function, and a plastic part of the waterproof plug (101) is pressed with the side key (104) to conduct a pressing action to a switch (102) on a mainboard (103); 2) With the double-shot molding technology, the side-key part is injected onto the shell in a form of rubber (TPU), and the deformability of the rubber and PC itself is used to provide a deformation space for the side-key pressing; and 3) Waterproofing of the key body is realized with the independent key scheme.

The mobile phones using the above structural forms all have certain defects respectively: for the structural mode of the scheme 1, the related process is complicated and the molding cost is relatively high, in general, this scheme is only adopted in high-end mobile phones at present, which is not prospective to have application in various grades of waterproof mobile phones. For the structural mode of the scheme 2, since it is required to inject and mold the side key in a form of rubber with the PC of the shell together by using the double-shot molding technology, there is a great limitation on side-key material selection and appearance processing, and the rigidity of the rubber part of the side key has a great impact on the side-key hand feeling, and when the rubber is used as the side key, if it encounters a maintenance resulted from the puncture of sharp objects, the entire structural component needs to be completely replaced, which has very high maintenance costs. For the structural mode of the scheme 3, though it has flexible replace ability and good appearance processing capacity, the required design space is too large, which is not convenient for production and assembly and does not follow the tendency of waterproof miniaturization.

Therefore, a problem that balanced consideration cannot be given to costs, waterproof performance and miniaturization for waterproofing of the terminal exists in the existing technology.

SUMMARY

The embodiments of the present document provide a waterproof apparatus for a terminal side key and a terminal, to at least solve the problem that balanced consideration cannot be given to costs, waterproof performance and miniaturization for waterproofing of the terminal existing in the existing technology.

An embodiment of the present document provides a waterproof apparatus for a terminal side key, including: a terminal shell (1) with a sidewall hole that is filled with a terminal side key (3), and a terminal side-key circuit board component (2) connected to a terminal mainboard (4), herein, the terminal side-key circuit board component (2) includes: a side-key circuit board (23), an arched metal film (22) fixedly connected to the side-key circuit board, and a circuit board waterproof ring (21) used for wrapping the side-key circuit board (23) and the arched metal film (22) as a whole, herein, the circuit board waterproof ring (21) wrapping the side-key circuit board (23) and the arched metal film (22) as a whole is combined with a sidewall of the terminal shell (1) in an interference-fitted manner.

Alternatively, a location limiting component (13) used for limiting a location of the terminal side-key circuit board component (2) exists between the terminal shell (1) and the terminal side-key circuit board component (2).

Alternatively, the location limiting component (13) is a shell side-key circuit board waterproof sidewall (12) that protrudes from a frame of an inwall of the terminal shell (1).

Alternatively, the terminal side key (3) is formed by integrating side-key rubber (31) and side-key polycarbonate (PC) (32) through injection molding.

Alternatively, the mainboard (4) positioned by a mainboard positioning hole (41) and a shell positioning pillar (1) supports the terminal side-key circuit board component (2) by contacting with a mainboard support side (42) at aside of the terminal side-key circuit board component (2).

Alternatively, the terminal mainboard (4) and the terminal side-key circuit board component (2) are connected in a manner of wire soldering or flexible printed circuit board, FPC, connection.

Alternatively, the circuit board waterproof ring (21) is a rubber waterproof ring.

Alternatively, the rubber waterproof ring is in a shape of an annular frame.

Alternatively, the arched metal film (22) is replaced with a flexible printed circuit board, FPC.

According to another embodiment of the present document, a terminal is provided, which includes: one or a plurality of waterproof apparatuses for a terminal side key mentioned in any items above.

Alternatively, the terminal is a mobile phone.

Through the scheme of the embodiments of the present document, the problem that balanced consideration cannot be given to costs, waterproof performance and miniaturization for waterproofing of the terminal existing in the existing technology is solved, thereby achieving the effect of low costs, high waterproof grades and simplified assembly.

BRIEF DESCRIPTION OF DRAWINGS

Here, the described accompanying drawings are used to provide a further understanding of the present document and constitute a part of the present document. The schematic embodiments and illustrations thereof of the present document t are used to explain the present document, but do not constitute an inappropriate limitation on the present document. In the drawings:

FIGS. 1A-1C are schematic diagrams of a structure of a waterproof apparatus for a side key in the existing technology;

FIGS. 6A-6C are schematic diagrams of a structure of a side-key circuit board component (2) of the waterproof apparatus according to the present document;

FIG. 7 is a schematic diagram of installing a side key (3) into an opening for the sidekey on a shell (11) according to the present document;

PREFERRED EMBODIMENTS

The present document will be described in detail with reference to the accompanying drawings and in combination with the embodiments below. It should be noted that the embodiments in the present document and the characteristics in the embodiments may be arbitrarily combined with each other in the case of no conflict.

Figure 2:
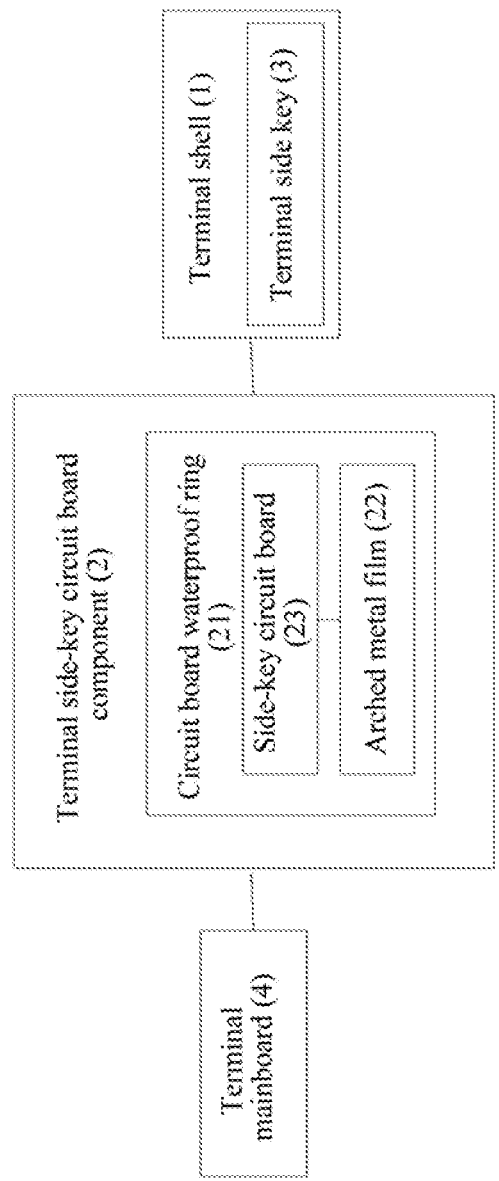
FIG. 2 is a schematic diagram of a structure of a waterproof apparatus for a terminal side key according to an embodiment of the present document.

A waterproof apparatus for a terminal side key is provided in the embodiment, FIG. 2 is a schematic diagram of a structure of a waterproof apparatus for a terminal side key according to an embodiment of the present document, and as shown in FIG. 2, the waterproof apparatus for the terminal side key includes: a terminal shell (1) with a sidewall hole that is filled with a terminal side key (3), and a terminal side-key circuit board component (2) connected to a terminal mainboard (4), herein, the terminal side-key circuit board component (2) includes: a side-key circuit board (23), an arched metal film (22) fixedly connected to the side-key circuit board, and a circuit board waterproof ring (21) used for wrapping the side-key circuit board (23) and the arched metal film (22) as a whole, herein, the circuit board waterproof ring (21) wrapping the side-key circuit board (23) and the arched metal film (22) as a whole is combined with a sidewall of the terminal shell (1) in an interference-fitted manner. It should be noted that the arched metal film (22) can be replaced with a flexible printed circuit board, FPC.

Alternatively, a location limiting component (13) used for limiting a location of the terminal side-key circuit board component (2) may be set between the terminal shell (1) and the terminal side-key circuit board component (2). The terminal side key (3) may be formed by integrating side-key rubber (31) and side-key polycarbonate (PC) (32) in an injection molding manner. Herein, the mainboard (4) positioned by a mainboard positioning hole (41) and a shell positioning pillar (1) supports the terminal side-key circuit board component (2) by contacting with a mainboard support side (42) at the side of the terminal side-key circuit board component (2).

Alternatively, the terminal mainboard (4) and the terminal side-key circuit board component (2) are connected through wire soldering or flexible printed circuit board, FPC, connection. The circuit board waterproof ring (21) may use a rubber waterproof ring.

Figure 3:
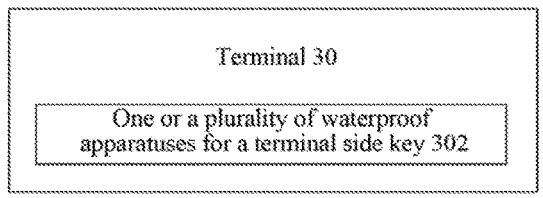
FIG. 3 is a schematic diagram of a structure of a terminal according to an embodiment of the present document.

FIG. 3 is a schematic diagram of a structure of a terminal according to an embodiment of the present document, and the terminal 30 includes one or a plurality of waterproof apparatuses 302 for a terminal side key as shown in FIG. 3. Alternatively, the terminal may be a mobile phone.

With respect to the above problem in the existing technology, a new-style mobile phone side key and circuit board waterproof structure is provided in the embodiment, which may not only implement miniaturized waterproofing of components like the side key, but also provide a reliable high-grade waterproofing guarantee. Taking the terminal being a mobile phone as an example, the waterproof structure includes: a mobile phone shell structure, a mobile phone side key structure, a mobile phone side-key circuit board component (including a circuit board, an arched metal film or an FPC-type side key switch and a rubber waterproof ring) and a mobile phone mainboard. The side key of the mobile phone is assembled on the mobile phone shell first, then the mobile phone side-key circuit board component is assembled on the mobile phone shell, and the mobile phone mainboard is assembled at last, that process is a conventional mobile phone production assembly process, but the mobile phone side key using the scheme has the waterproof characteristic due to the waterproof design related in the present document.

In the above scheme, after the side key is assembled on the shell, the arched metal film or the FPC-type side key switch on the side-key circuit board may be pressed through swing the side key to conduct a user action to the side key switch, so as to make a side key function take effect. (Since functions of both the arched metal film and the Flexible Printed Circuit Board (FPC)-type side key switch are to turn a pressing function of the key into a mobile phone signal, descriptions will be made by taking the arched metal film as an example.)

A reliable high-grade waterproof guarantee is provided for the mobile phone by using the rubber waterproof ring in the circuit board component and the sealing effect of the shell. Moreover, after the mainboard is assembled on the shell, a supporting function is given to the inner side of the side-key circuit board, which may ensure that a hand-feeling difference caused by shifting will not appear in the side-key circuit board in the process of pressing the side key, and make the side-key circuit board component be always fixed to insure that the side-key waterproofness is not affected by frequently pressing the side key.

Through the above embodiments and alternative embodiments, it follows the development trend of waterproof miniaturization, which may provide a very high waterproof grade and reliability and is convenient for production and assembly.

The assembly of the present document will be described in combination with the above accompanying drawings below.

Figure 4:
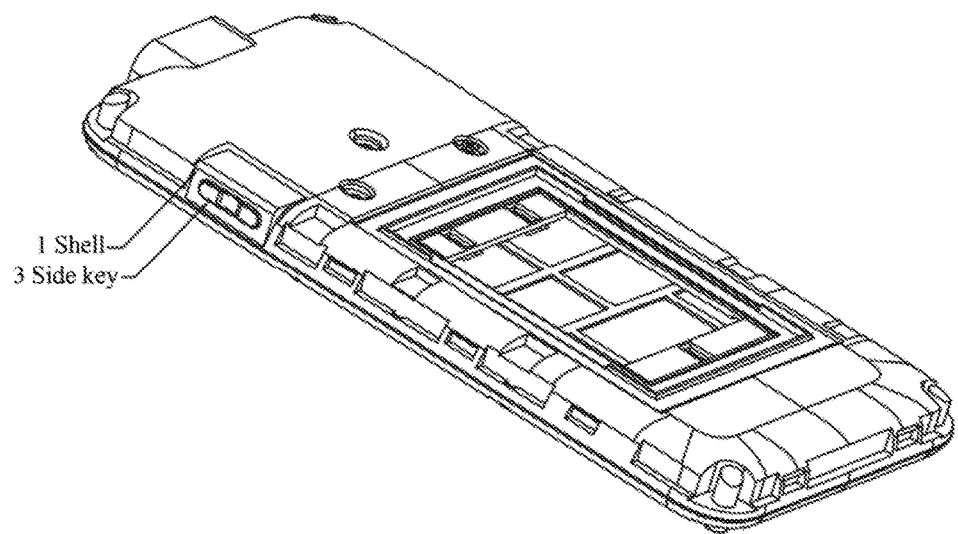
FIG. 4 is a schematic diagram of an assembly appearance of the waterproof apparatus according to the present document.

FIG. 4 is a schematic diagram of an assembly appearance of the waterproof apparatus according to the present document, and it is assembled on the shell (1) in a form of independent side key (3) as shown in FIG. 4, thus rich appearance processing can be implemented for a keycap of the side key (3).

Figure 5:
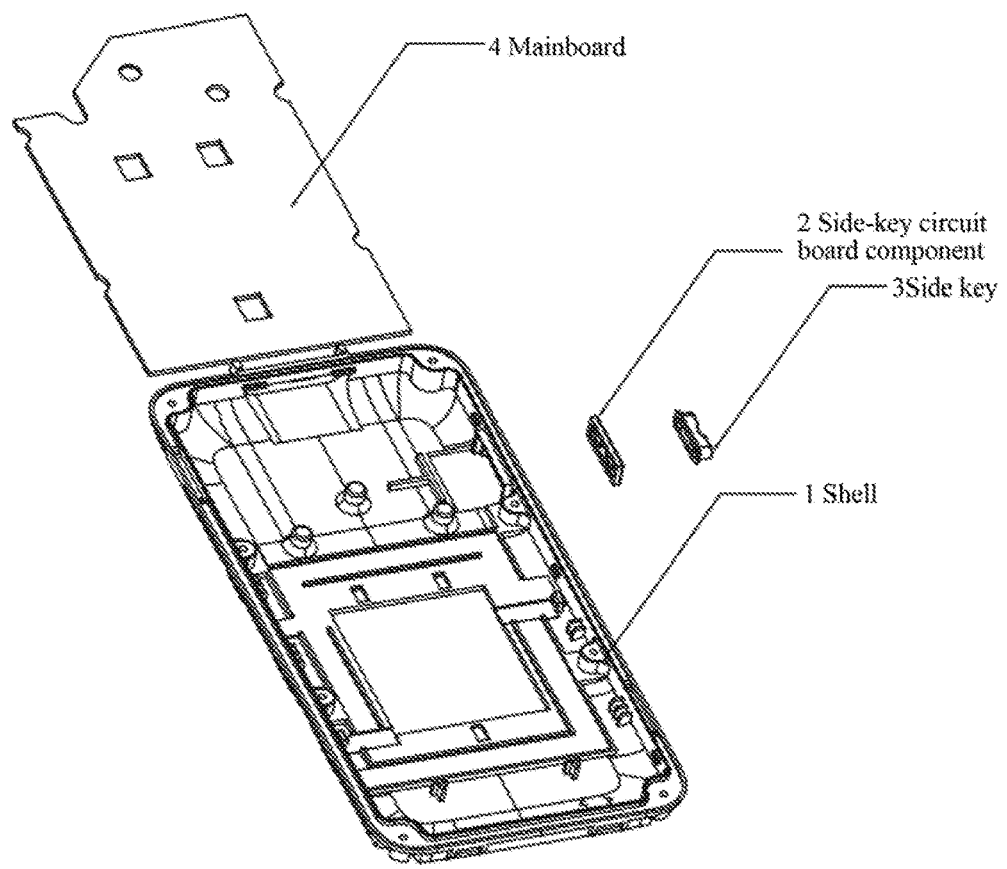
FIG. 5 is a schematic diagram of components decomposition of the waterproof apparatus according to the present document.

FIG. 5 is a schematic diagram of components decomposition of the waterproof apparatus according to the present document, and as shown in FIG. 5, the waterproof apparatus may be decomposed into four composition parts: a shell (1)

(similar to the above terminal shell (1)), a side-key circuit board component (2) (similar to the above terminal side-key circuit board component (2)), a side key (3) (similar to the above terminal side key (3)) and a mainboard (4) (similar to the above terminal mainboard (4)).

FIGS. 6A-6C are schematic diagrams of a structure of a side-key circuit board component (2) of the waterproof apparatus according to the present document, and as shown in FIGS. 6A-6C, the side-key circuit board component (2) may include three parts: a side-key circuit board waterproof ring (21), an arched metal film (22) and a side-key circuit board (23). The assembly order thereof is: firstly, pasting the arched metal film (22) on the side-key circuit board (23), and then putting the side-key circuit board waterproof ring (21) on a semi-finished product that has been assembled by the arched metal film (22) and the side-key circuit board (23), thereby completing the assembly of the side-key circuit board component.

The side key (3) is installed into an opening hole of the side key on the shell (11) first, FIG. 7 is a schematic diagram of installing a side key (3) into an opening hole of the side key on a shell (11) according to the present document.

Figures 8A, 8B:
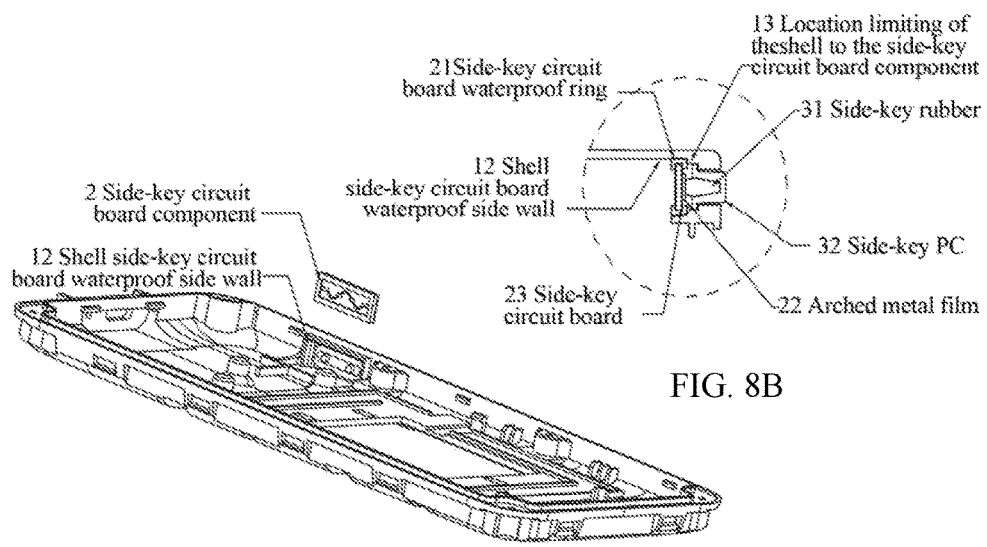
FIGS. 8A-8B are schematic diagrams of being equipped with a side key (3) and a side-key circuit board component (2) according to the present document.

FIGS. 8A-8B are schematic diagrams of being equipped with a side key (3) and a side-key circuit board component (2) according to the present document, as shown in FIGS. 8A-8B, such an installation order can be used, the assembled side-key circuit board component (2) as shown in FIG. 4 is stuffed into a shell side-key circuit board waterproof sidewall (12) as shown by the amplification at the top right corner, the interference of the side-key circuit board waterproof ring (21) and the shell side-key circuit board waterproof sidewall (12) achieves the circumferential waterproofing of the circuit board, along with the assembly direction of the side-key circuit board component (2), as long as it comes into contact with a location limiting structure (13) of the shell to the side-key circuit board component (2), it indicates that the assembly is in place and the assembly of the side-key circuit board component (2) is completed. The side key is formed by integrating side-key rubber (31) and side-key PC (32) with the double injection molding technique, when the side-key PC (32) is pressed, the side-key rubber (31) will press the arched metal film (22) to make the action take effect.

Figure 9:
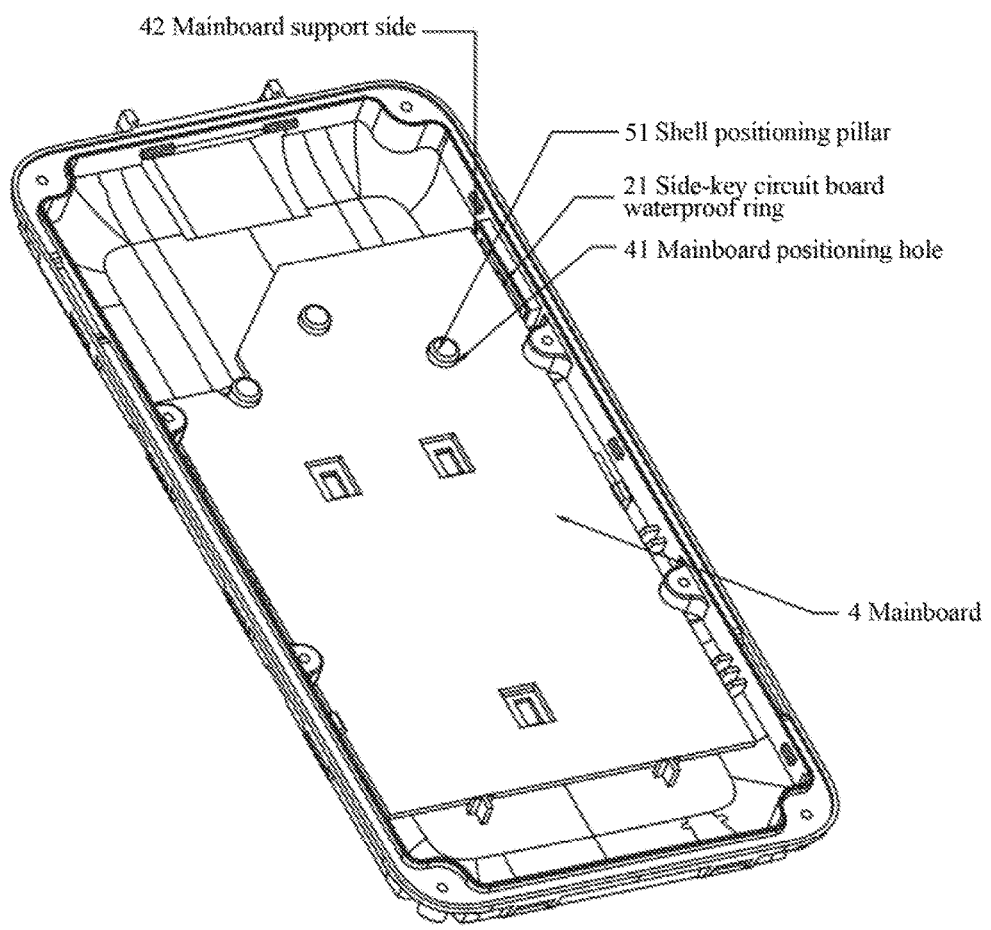
FIG. 9 is a schematic diagram of being equipped with a side key (3), a side-key circuit board component (2) and a mainboard (4) according to the present document.

FIG. 9 is a schematic diagram of being equipped with a side key (3), a side-key circuit board component (2) and a mainboard (4) according to the present document, as shown in FIG. 9, the mainboard (4) is assembled on the shell (1), with the help of a mainboard positioning hole (41) structure and a shell positioning pillar (51) structure, the location of the mainboard (4) on the shell (1) is limited, thus after the mainboard (4) is fixed, the side-key circuit board component (2) may be better fixed through a mainboard support side (42) at the inner side of the side-key circuit board component (2). Therefore, even though the side key (3) is pressed frequently, the side-key circuit board (2) is always in a designed location due to the location limiting structure (13) of the shell to the side-key circuit board and the supporting function of the mainboard support side (42), thereby guaranteeing good hand feeling and consistency. The displayed mainboard (4) and the side-key circuit board (23) may be connected through a scheme of wire soldering or flexible printed circuit board (FPC) (but it is not limited to these two electrical connection modes), so that pressing on the side key may transfer an electric signal to the mainboard to take effect.

The above description is only the alternative embodiments of the present document, which is not used to limit the present document. The present document may have various modifications and changes for the people skilled in the art. Any modifications, equivalent substitutions, and improvements, etc, made within the spirit and principle of the present document shall be contained in the protection scope of the present document.

INDUSTRIAL APPLICABILITY

The effect of low costs, high waterproof grades and simplified assembly is achieved in the embodiment of the present document.

What is claimed is:

1. A waterproof apparatus for a terminal side key, comprising: a terminal shell (1) with a sidewall hole that is filled with a terminal side key (3), and a terminal side-key circuit board component (2) connected to a terminal mainboard (4), wherein,
    the terminal side-key circuit board component (2) comprises: a side-key circuit board (23), an arched metal film (22) fixedly connected to the side-key circuit board, and a circuit board waterproof ring (21) used for wrapping the side-key circuit board (23) and the arched metal film (22) as a whole, wherein, the circuit board waterproof ring (21) wrapping the side-key circuit board (23) and the arched metal film (22) as a whole is combined with a shell side-key circuit board waterproof sidewall (12) in an interference-fitted manner, and the mainboard (4) supports the terminal side-key circuit board component (2) by contacting with a mainboard support side (42) at an inner side of the terminal side-key circuit board component (2).

2. The apparatus according to claim 1, wherein, the terminal side key (3) is formed by integrating side-key rubber (31) and side-key polycarbonate (PC) (32) through injection molding.

3. The apparatus according to claim 1, wherein, the mainboard (4) is positioned by a mainboard positioning hole (41) and a shell positioning pillar (1).

4. The apparatus according to claim 1, wherein, the terminal mainboard (4) and the terminal side-key circuit board component (2) are connected in a manner of wire soldering or flexible printed circuit board, FPC, connection.

5. The apparatus according to claim 1, wherein, the arched metal film (22) is replaced with a flexible printed circuit board, FPC, type side key switch.

6. The apparatus according to claim 1, wherein, a location limiting component (13) used for limiting a location of the terminal side-key circuit board component (2) exists between the terminal shell (1) and the terminal side-key circuit board component (2).

7. The apparatus according to claim 6, wherein the location limiting component (13) is the shell side-key circuit board waterproof sidewall (12) that protrudes from a frame of an inwall of the terminal shell (1).

8. The apparatus according to claim 1, wherein, the circuit board waterproof ring (21) is a rubber waterproof ring.

9. The apparatus according to claim 8, wherein the rubber waterproof ring is in a shape of an annular frame.

10. A terminal, comprising: one or a plurality of waterproof apparatuses for the terminal side key according to claim 1.

11. The terminal according to claim 10, wherein, the terminal is a mobile phone.

* * * * *